(12) United States Patent
Chang et al.

(10) Patent No.: US 8,552,762 B2
(45) Date of Patent: Oct. 8, 2013

(54) LOW-POWER WIRE-OR MATCHING CIRCUIT

(75) Inventors: Chia-Wei Chang, Tainan (TW); Feng-Chia Chang, New Taipei (TW)

(73) Assignee: Etron Technology, Inc., Hsinchu (TW)

( * ) Notice: Subject to any disclaimer, the term of this patent is extended or adjusted under 35 U.S.C. 154(b) by 243 days.

(21) Appl. No.: 13/278,174

(22) Filed: Oct. 20, 2011

(65) Prior Publication Data

US 2012/0105106 A1    May 3, 2012

(30) Foreign Application Priority Data

Nov. 2, 2010 (TW) .............................. 099137692 A

(51) Int. Cl.
    H03K 19/20    (2006.01)
(52) U.S. Cl.
    USPC .................................. 326/114; 326/86; 326/95
(58) Field of Classification Search
    USPC ..................... 326/114, 119, 82, 86, 83, 93, 95
    See application file for complete search history.

(56) References Cited

U.S. PATENT DOCUMENTS

| 4,386,284 | A  | * | 5/1983 | Wacyk et al. | ................. 327/170 |
| 4,404,474 | A  | * | 9/1983 | Dingwall | ....................... 327/170 |
| 6,429,689 | B1 | * | 8/2002 | Allen et al. | ...................... 326/95 |
| 7,023,242 | B2 | * | 4/2006 | Brand et al. | .................... 326/82 |

* cited by examiner

*Primary Examiner* — Daniel D Chang
(74) *Attorney, Agent, or Firm* — Winston Hsu; Scott Margo

(57) ABSTRACT

A wire-OR matching circuit with low power consumption can be enabled by inputting an input-enabling signal representing "enabled." The wire-OR matching circuit generates an output-enabling signal according to a control signal and a periodic pulse signal. When the periodic pulse signal represents "turn on", if the input-enabling signal represents "enabled" and the control signal represents "not disabled", the output-enabling signal represents "enabled;" if the input-enabling signal represents "enabled" and the control signal represents "disabled", the output-enabling signal represents "not enabled." The wire- or matching circuit can promptly break the connection between the high voltage source and the low voltage source by controlling the pulse width of the periodic pulse signal. In this way, large current is avoided, saving power consumption.

17 Claims, 6 Drawing Sheets

LOW-POWER WIRE-OR MATCHING CIRCUIT

BACKGROUND OF THE INVENTION

1. Field of the Invention

The present invention is related to wire-OR matching circuits, and particularly to a low-power wire-OR matching circuit.

2. Description of the Prior Art

In Dynamic Random Access Memory (DRAM), a wire-OR matching circuit may be used to determine whether a memory unit to be accessed is a damaged memory unit according to an access address. When the wire-OR matching circuit determines that the access address is the same as the address of the damaged memory unit, the wire-OR matching circuit enables a backup memory unit to replace the known damaged memory unit, so that the DRAM can be accessed normally.

Please refer to FIG. 1. FIG. 1 is a diagram of wire-OR matching circuit 100. Wire-OR matching circuit 100 comprises an input inverter $INV_1$, an output inverter $INV_2$, and a disabling module 110. Input node I of input inverter $INV_1$ receives input-enabling signal $S_{ENI}$, and determines whether to generate output-enabling signal $S_{ENO}$ at output node O of output inverter $INV_2$ according to state of disabling module 110. Additionally, in wire-OR matching circuit 100, when input-enabling signal $S_{ENI}$ and output-enabling signal $S_{ENO}$ are logic 0 (low voltage), input-enabling signal $S_{ENI}$ and output-enabling signal $S_{ENO}$ represent "enabled". When input-enabling signal $S_{ENI}$ and output-enabling signal $S_{ENO}$ are logic 1 (high voltage), input-enabling signal $S_{ENI}$ and output-enabling signal $S_{ENO}$ represent "disabled".

Input inverter $INV_1$ is used for inverting input-enabling signal $S_{ENI}$ to output middle signal $S_{MI}$. Input inverter $INV_1$ comprises transistors $Q_{P1}$, $Q_{N1}$. Transistor $Q_{P1}$ can be realized as a P-channel metal oxide semiconductor (PMOS) transistor, and transistor $Q_{N1}$ can be realized as an N-channel metal oxide semiconductor (NMOS) transistor. As shown in FIG. 1, first node 1 of transistor $Q_{P1}$ is power node $PW_1$ of input inverter $INV_1$, which is coupled to voltage source $V_{DD}$; second node 2 of transistor $Q_{P1}$ is coupled to output node O of input inverter $INV_1$; and control node (gate) C of transistor $Q_{P1}$ is coupled to input node I of input inverter $INV_1$. First node 1 of transistor $Q_{N1}$ is coupled to output node O of input inverter $INV_1$; second node 2 of transistor $Q_{N1}$ is power node $PW_2$ of input inverter $INV_1$, which is coupled to voltage source $V_{SS}$; and control node (gate) C of transistor $Q_{N1}$ is coupled to input node I of input inverter $INV_1$. Additionally, voltage source $V_{DD}$ supplies voltage $V_{DD}$ (high voltage); and voltage source $V_{SS}$ supplies voltage $V_{SS}$ (low voltage, e.g. ground). When input inverter $INV_1$ receives input-enabling signal $S_{ENI}$ representing "enabled" (logic 0, low voltage), transistor $Q_{P1}$ conducts, so that output node O of input inverter $INV_1$ couples to voltage source $V_{DD}$ through transistor $Q_{P1}$. Thus, voltage on output node O of input inverter $INV_1$ is pulled up to high voltage and outputs middle signal $S_{MI}$ representing logic 1 (high voltage); when input inverter $INV_1$ receives input-enabling signal $S_{ENI}$ representing "disabled" (logic 1, high voltage), transistor $Q_{N1}$ conducts, so that output node O of input inverter $INV_1$ couples to voltage source $V_{SS}$ through transistor $Q_{N1}$. Thus, voltage on output node O of input inverter $INV_1$ is pulled down to low voltage and outputs middle signal $S_{MI}$ representing logic 0 (low voltage).

Output inverter $INV_2$ is used for inverting middle signal $S_{MI}$ to generate output-enabling signal $S_{ENO}$. When middle signal $S_{MI}$ represents logic (high voltage), output inverter $INV_2$ outputs output-enabling signal $S_{ENO}$ representing "enabled" (logic 0, low voltage). When middle signal $S_{MI}$ represents logic 0 (low voltage), output inverter $INV_2$ outputs output-enabling signal $S_{ENO}$ representing "disabled" (logic 1, high voltage).

Disabling module 110 comprises switches $SW_1$-$SW_M$. Control nodes C of switches $SW_1$-$SW_M$ respectively receive sub-control signals $S_{C1}$-$S_{CM}$ comprised by control signals $S_C$; first nodes 1 of switches $SW_1$-$SW_M$ are all coupled to output node O of input inverter $INV_1$; second nodes of switches $SW_1$-$SW_M$ are all coupled to voltage source $V_{SS}$. Each switch $SW_1$-$SW_M$ couples its first node 1 to its second node 2 according to the sub-control signal received. For example, switches $SW_1$-$SW_M$ may be realized as NMOS transistors. Thus, when sub-control signal $S_{CK}$ is logic 1 (high voltage), sub-control signal $S_{CK}$ represents "turn on," such that first node 1 of switch $SW_K$ couples to second node 2 of switch $SW_K$; when sub-control signal $S_{CK}$ is logic 0 (low voltage), sub-control signal $S_{CK}$ represents "turn off," such that first node 1 of switch $SW_K$ does not couple to second node 2 of switch $SW_K$.

When control signal $S_C$ represents "disabled," it means that at least one sub-control signal (e.g. sub-control signal $S_{CK}$) of the sub-control signals $S_{C1}$-$S_{CM}$ indicates "turn on." Thus, in the disabling module 110, first node 1 of switch $SW_K$ corresponding to sub-control signal $S_{CK}$ is coupled to second node 2 of switch $SW_K$. In this way, output node O of input inverter $INV_1$ couples to voltage source $V_{SS}$ through switch $SW_K$, causing middle signal $S_{MI}$ to be pulled down to low voltage (logic 0) by voltage source $V_{SS}$. Thus, when control signal $S_C$ represents "disabled," disabling module 110 controls middle signal $S_{MI}$ outputted by input inverter $INV_1$ to represent logic 0 (low voltage). However, when control signal $S_C$ represents "not disabled," it means that all sub-control signals $S_{C1}$-$S_{CM}$ are "turn off," so none of the switches $SW_1$-$SW_M$ conducts. In this way, disabling module 110 does not affect logic represented by middle signal $S_{MI}$.

In wire-OR matching circuit 100, when input-enabling signal $S_{ENI}$ represents "enabled," disabling module 110 determines whether or not to control logic represented by middle signal $S_{MI}$ according to control signal $S_C$, so as to disable output inverter $INV_2$. For example, assume input-enabling signal $S_{ENI}$ representing "enable" is inputted to wire-OR matching circuit 100. If a memory address to be accessed in DRAM is different from a known corrupted memory address, control signal $S_C$ will represent "disabled." Thus, regardless of whether the input-enabling signal $S_{ENI}$ received by input inverter $INV_1$ represents "enabled" or "disabled," disabling module 110 will control logic represented by middle signal $S_{MI}$ to be 0, so as to disable output inverter $INV_2$, and make output inverter $INV_2$ output output-enabling signal $S_{ENO}$ as "not enabled." Thus, wire-OR matching circuit 110 will not enable backup memory. However, if the memory address to be accessed in DRAM is the same as a known corrupted memory address, control signal $S_C$ will represent "not disabled." Thus, disabling module 110 will not affect logic represented by middle signal $S_{MI}$, so that output inverter $INV_2$ can output output-enabling signal $S_{ENO}$ representing "enabled" according to middle signal $S_{MI}$ representing logic 1 under condition that input-enabling signal $S_{ENI}$ represents "enabled" (logic 0). In this way, wire-OR matching circuit 110 can enable backup memory to replace corrupted memory, so that DRAM can be accessed normally.

Please refer to FIG. 2. FIG. 2 is a waveform diagram illustrating internal control signals of wire-OR matching circuit 100 when input-enabling signal $S_{ENI}$ represents "enabled," and control signal $S_C$ represents "disabled" (e.g.

when at least one sub-control signal of sub-control signals $S_{C1}$-$S_{CM}$ represents "turn on"). Current $I_L$ is current outputted by output node O of inverter $INV_1$ of FIG. 1. Assume that sub-control signal $S_{CK}$ of sub-control signals $S_{C1}$-$S_{CM}$ represents "turn on" (logic 1, high voltage). Thus, output node O of input inverter $INV_1$ will couple to voltage source $V_{SS}$ through switch $SW_K$, and output node O of input inverter $INV_1$ will be pulled down to low voltage by voltage source $V_{SS}$, and output middle signal $S_{MI}$ representing logic 0. Thus, output inverter $INV_2$ will output output-enabling signal $S_{ENO}$ as "not enabled."

However, when input-enabling signal $S_{ENI}$ represents "enabled" (logic 0, low voltage), output node O of input inverter $INV_1$ will be coupled to voltage source $V_{DD}$ through transistor $Q_{P1}$. In other words, voltage source $V_{DD}$ will couple to voltage source $V_{SS}$ through transistor $Q_{P1}$ of input inverter $INV_1$ and switch $SW_K$. Thus, current $I_L$ will become a large current because voltage source $V_{DD}$ couples to voltage source $V_{SS}$. It can be seen that, in wire-OR matching circuit 100, when control signal $S_C$ represents "disabled" and input-enabling signal $S_{ENI}$ represents "enabled," voltage source $V_{DD}$ will couple to voltage source $V_{SS}$ through input inverter $INV_1$, generate high current, and cause high power consumption, which is a great inconvenience to the user.

SUMMARY OF THE INVENTION

According to an embodiment, a wire-OR matching circuit having low power consumption comprises an input inverter, a power switch, a logic processor, a disabling module, and an output inverter. The input inverter is for inverting an input-enabling signal to generate a middle signal. The power switch is coupled between the input inverter and a first voltage source for controlling the first voltage source to power the input inverter according to a power switch control signal. When the power switch control signal represents "turn on," the first voltage source powers the input inverter through the power switch. The logic processor is for receiving a periodic pulse signal and an output-enabling signal, and outputting the power switch control signal according thereto. When the periodic pulse signal represents "turn on," the power switch control signal represents "turn on." When the periodic pulse signal represents "turn off" and the output-enabling signal represents "not enabled," the power switch control signal represents "turn off." When the periodic pulse signal represents "turn off" and the output-enabling signal represents "enabled," the power switch control signal represents "turn on." The periodic pulse signal represents "turn on" each one predetermined period, and keeps a predetermined pulse width. The disabling module is for controlling the middle signal to represent a first predetermined logic according to a control signal. When the control signal represents "disabled" or the input-enabling signal represents "not enabled," the middle signal represents the first predetermined logic. When the control signal represents "not disabled," and the input-enabling signal represents "enabled," the middle signal represents a second predetermined logic. The output inverter is for inverting the middle signal to generate the output-enabling signal. When the middle signal represents the first predetermined logic, the output-enabling signal represents "not enabled." When the middle signal represents the second predetermined logic, the output-enabling signal represents "enabled."

According to an embodiment, a wire-OR matching circuit having low power consumption comprises an output node, a disabling module, and a current control circuit. The output node is for outputting an output-enabling signal. The disabling module is coupled between a first reference voltage and a control output node, and comprises a plurality of switches. Each switch has a first node coupled to the first reference voltage, and another node coupled to the control output node. Voltage of the output-enabling signal is inverse of voltage of the control output node. The current control circuit is coupled to the output node, the control output node, and a second reference voltage. The current control circuit selectively cuts off a leakage current between the second reference voltage and the disabling module according to a periodic clock signal and the output-enabling signal.

These and other objectives of the present invention will no doubt become obvious to those of ordinary skill in the art after reading the following detailed description of the preferred embodiment that is illustrated in the various figures and drawings.

DETAILED DESCRIPTION

In light of the above, the embodiments herein provide a wire-OR matching circuit that rapidly disconnects input inverter from power according to "not enabled" output-enabling signal to prevent high current generation and high power consumption when input-enabling signal $S_{ENI}$ represents "enabled" and control signal represents "disabled."

Figure 1:
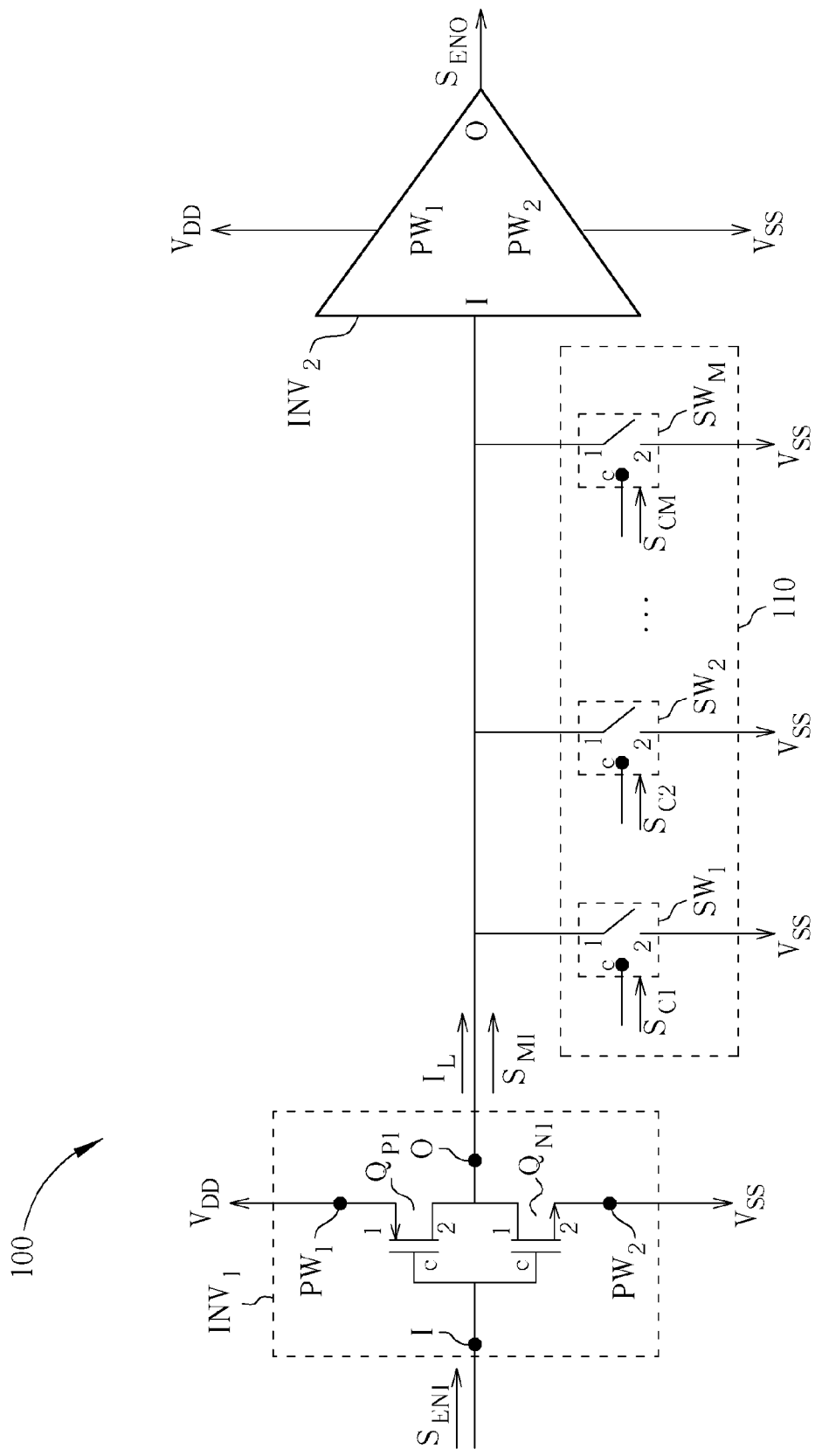
FIG. 1 is a diagram of wire-OR matching circuit.
Figure 2:
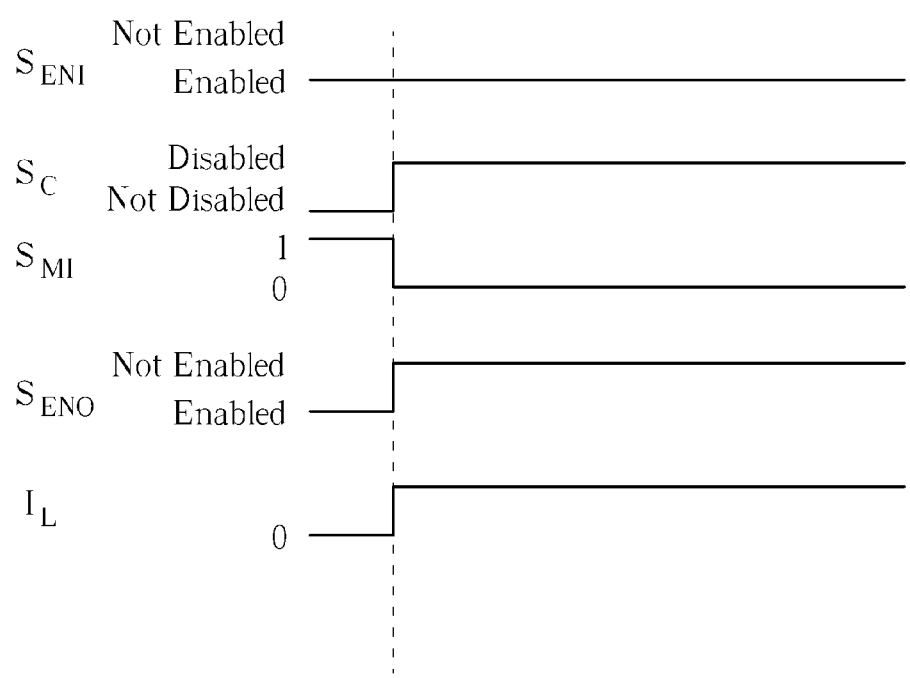
FIG. 2 is a waveform diagram illustrating internal control signals of wire-OR matching circuit when input-enabling signal represents "enabled," and control signal represents "disabled."
Figure 3:
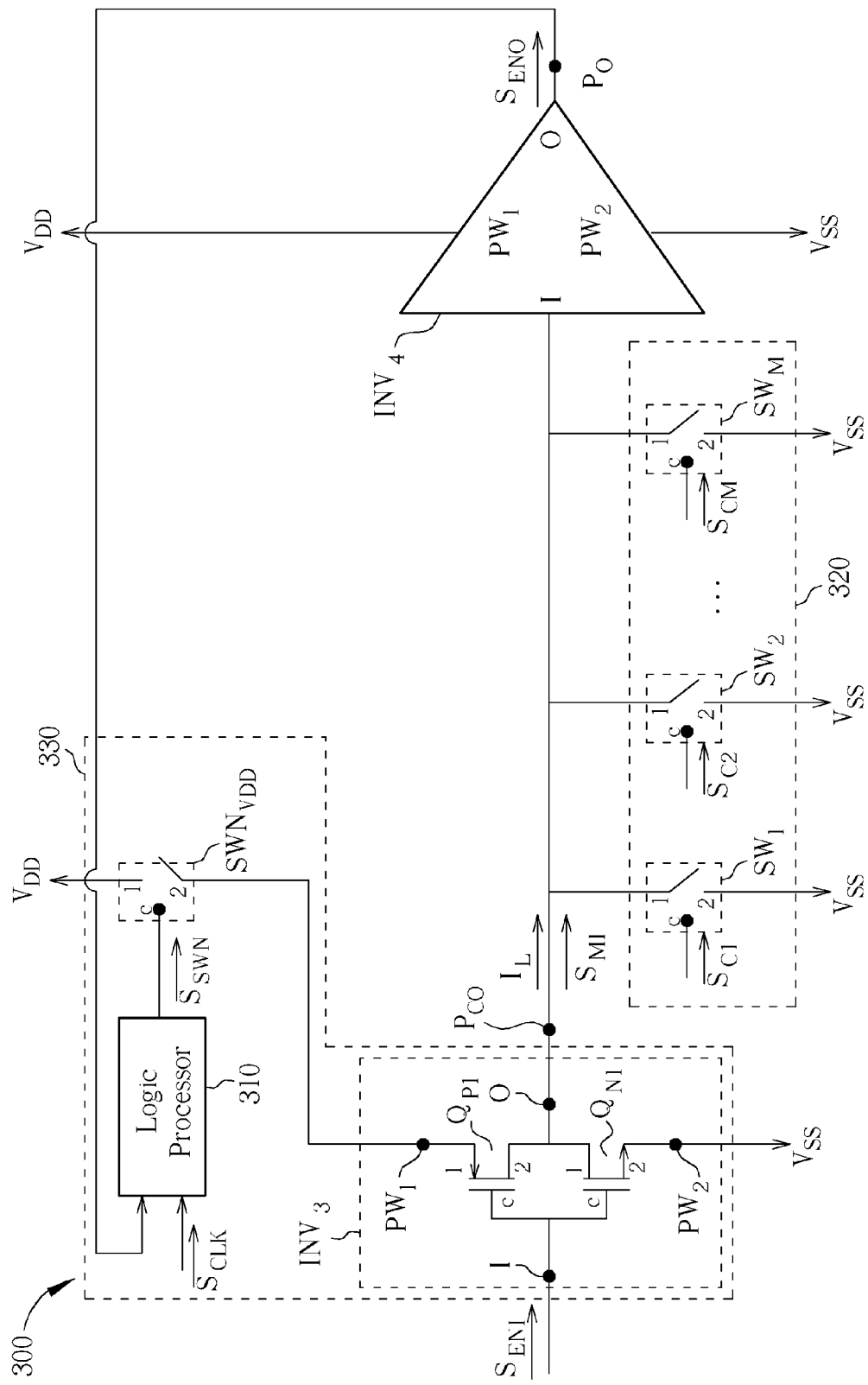
FIG. 3 is a diagram of wire-OR matching circuit according to an embodiment.

Please refer to FIG. 3. FIG. 3 is a diagram of wire-OR matching circuit 300 according to an embodiment. Wire-OR matching circuit 300 comprises an output node $P_O$, an output inverter $INV_4$, a disabling module 320, and a current control circuit 330. Current control circuit 330 comprises a logic processor 310, an input inverter $INV_3$, and a power switch $SWN_{VDD}$. Input inverter $INV_3$, output inverter $INV_4$, and disabling module 320 have similar structure and function to input inverter $INV_1$, output inverter $INV_2$ and disabling module 110, respectively, so description thereof is omitted here. Output node $P_O$ is output node O of output inverter $INV_4$. In other words, output node $P_O$ is used for generating output-enabling signal $S_{ENO}$. Additionally, node $P_{CO}$ of FIG. 3 represents a control output node, control output node $P_{CO}$ is coupled to input node I of output inverter $INV_4$ and output node O of input inverter $INV_3$, and voltage of control output node $P_{CO}$ is the inverse of voltage of output-enabling signal $S_{ENO}$.

Power switch $SWN_{VDD}$ is coupled between input inverter $INV_3$ and voltage supply $V_{DD}$, and has control node C coupled to output node of logic processor 310 for receiving power switch control signal $S_{SWN}$. Power switch $SWN_{VDD}$ is used for controlling whether or not voltage source $V_{DD}$ powers input inverter $INV_3$ according to power switch control signal $S_{SWN}$. More specifically, when power switch control signal $S_{SWN}$ represents "turn on," first node 1 of power switch $SWN_{VDD}$ couples to second node 2 of power switch $SWN_{VDD}$, so that voltage source $V_{DD}$ can couple to power node $PW_1$ of input inverter $INV_3$ to power input inverter $INV_3$. However, when power switch control signal $S_{SWN}$ represents "turn off," first node 1 of power switch $SWN_{VDD}$ does not couple to second node 2 of power switch $SWN_{VDD}$. In this way, voltage source $V_{DD}$ cannot couple to power node $PW_1$ of input inverter $INV_3$ through power switch $SWN_{VDD}$, and does not power input inverter $INV_3$. Additionally, power switch $SWN_{VDD}$ can be realized by a PMOS transistor. In this way, when power switch control signal $S_{SWN}$ is logic 0 (low voltage), power switch control signal $S_{SWN}$ represents "turn on," so that power switch $SWN_{VDD}$ conducts. When power switch control signal $S_{SWN}$ is logic 1 (high voltage), power switch control signal $S_{SWN}$ represents "turn off," so that power switch $SWN_{VDD}$ does not conduct.

Logic processor 310 outputs power switch control signal $S_{SWN}$ according to periodic pulse signal $S_{CLK}$ and output-enabling signal $S_{ENO}$. When logic processor 310 receives periodic pulse signal $S_{CLK}$ representing "turn on," logic processor 310 outputs power switch control signal $S_{SWN}$ representing "turn on." However, when periodic pulse signal $S_{CLK}$ represents "turn off," power switch control signal $S_{SWN}$ outputted by logic processor 310 is dependent on output-enabling signal $S_{ENO}$. If, at this time, output-enabling signal $S_{ENO}$ represents "enabled," logic processor 310 outputs power switch control signal $S_{SWN}$ representing "turn on." However, if output-enabling signal $S_{ENO}$ represents "not enabled," logic processor 310 will output power switch control signal $S_{SWN}$ representing "turn off."

Because voltage source $V_{DD}$ does not power input inverter $INV_3$ when power switch $SWN_{VDD}$ is turned off, even if input-enabling signal $S_{ENI}$ representing "enabled" and control signal $S_C$ representing "not enabled" are inputted, wire-OR matching circuit 300 cannot be made to generate output-enabling signal $S_{ENO}$ representing "enabled." In other words, when power switch $SWN_{VDD}$ is turned off, wire-OR matching circuit 300 can only generate output-enabling signal $S_{ENO}$ representing "not enabled." When power switch $SWN_{VDD}$ conducts, voltage source $V_{DD}$ can power input inverter $INV_3$. At this time, wire-OR matching circuit 300 is similar to wire-OR matching circuit 100, and inputting input-enabling signal $S_{ENI}$ representing "enabled" can cause wire-OR matching circuit 300 to generate output-enabling signal $S_{ENO}$ at corresponding logic level according to control signal $S_C$. Thus, logic processor 310 is designed to receive periodic pulse signal $S_{CLK}$ representing "turn on" every predetermined period $T_S$, to ensure that power switch $SWN_{VDD}$ conducts every predetermined period $T_S$ to cause wire-OR matching circuit 300 to generate output-enabling signal $S_{ENO}$ every predetermined period $T_S$ according to control signal $S_C$. Predetermined period $T_S$ is approximately equal to period of control signal $S_C$. In this way, wire-OR matching circuit 300 can detect changes in control signal $S_C$ in every period, and can generate output-enabling signal $S_{ENO}$ according to input-enabling signal $S_{ENI}$ and control signal $S_C$.

Figure 4:
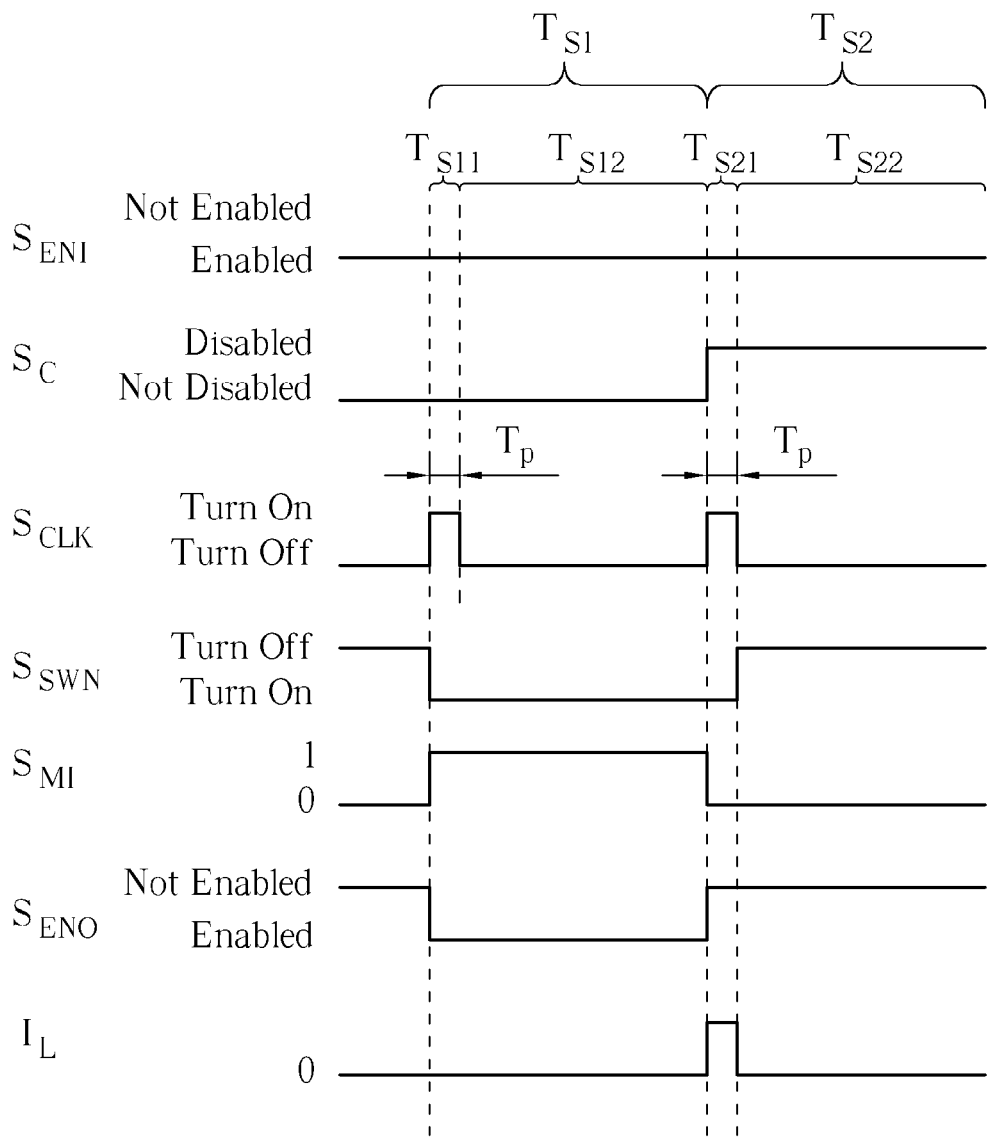
FIG. 4 is a diagram illustrating operating principles of wire-OR matching circuit of FIG. 3.

Please refer to FIG. 4. FIG. 4 is a diagram illustrating operating principles of wire-OR matching circuit 300. FIG. 4 can be described in terms of detection period $T_{S1}$ and detection period $T_{S2}$. Detection periods $T_{S1}$, $T_{S2}$ both have length of predetermined period $T_S$. In detection period $T_{S1}$, input-enabling signal $S_{ENI}$ is set to represent "enabled," and control signal $S_C$ represents "not disabled." In detection period $T_{S2}$, input-enabling signal $S_{ENI}$ represents "enabled," and control signal $S_C$ represents "disabled."

In segment $T_{S11}$ of detection period $T_{S1}$, logic processor 310 receives periodic pulse signal $S_{CLK}$ representing "turn on," and outputs power switch control signal $S_{SWN}$ representing "turn on" accordingly. Segment $T_{S11}$ has length equal to predetermined pulse width $T_P$ of periodic pulse signal $S_{CLK}$ representing "turn on." At this time, power switch $SWN_{VDD}$ conducts, thus voltage source $V_{DD}$ couples to input inverter $INV_3$ through power switch $SWN_{VDD}$ to power input inverter $INV_3$, so that input inverter $INV_3$ can operate normally. Because, at this time, control signal $S_C$ represents "not disabled," disabling module 320 will not affect logic represented by middle signal $S_{MI}$. More specifically, at this time, sub-control signals $S_{C1}$-$S_{CM}$ are all "turn off," so that no switch $SW_1$-$SW_M$ of disabling module 320 conducts. In other words, output node O of input inverter $INV_3$ cannot couple to voltage source $V_{SS}$ through switches $SW_1$-$SW_M$ of disabling module 320, and voltage of output node O of input inverter $INV_3$ will not be pulled down to low voltage by voltage source $V_{SS}$. In this way, input inverter $INV_3$ outputs middle signal $S_{MI}$ representing logic 1 (high voltage) according to input-enabling signal $S_{ENI}$ representing "enabled" (logic 0, low voltage), and output inverter $INV_4$ outputs output-enabling signal $S_{ENO}$ representing "enabled" (logic 0, low voltage) according to middle signal $S_{MI}$ representing logic 1 (high voltage). Additionally, no switch $SW_1$-$SW_N$ of disabling module 320 conducts, so voltage source $V_{DD}$ does not couple to voltage source $V_{SS}$. Thus, wire-OR matching circuit 300 will not generate high current.

In segment $T_{S12}$ of detection period $T_{S1}$, periodic pulse signal $S_{CLK}$ represents "turn off." At this time, power switch control signal $S_{SWN}$ outputted by logic processor 310 is dependent on output-enabling signal $S_{ENO}$. Because, at this time, output-enabling signal $S_{ENO}$ represents "enabled," logic processor 310 will continue to output power switch control signal $S_{SWN}$ representing "turn on." However, no switch $SW_1$-$SW_N$ of disabling module 320 conducts, so voltage source $V_{DD}$ still does not couple to voltage source $V_{SS}$. So it can be seen that when input-enabling signal $S_{ENI}$ represents "enabled" and control signal $S_C$ represents "not disabled," current $I_L$ outputted by input inverter $INV_3$ of wire-OR matching circuit 300 is zero, and will not cause extra power consumption.

In segment $T_{S21}$ of detection period $T_{S2}$, logic processor 310 receives periodic pulse signal $S_{CLK}$ representing "turn on," and outputs power switch control signal $S_{SWN}$ representing "turn on" accordingly. Segment $T_{S21}$ has length equal to predetermined pulse width $T_P$ of periodic pulse signal $S_{CLK}$ representing "turn on." At this time, power switch $SWN_{VDD}$ conducts, so voltage source $V_{DD}$ will couple to input inverter $INV_3$ through power switch $SWN_{VDD}$ to power input inverter $INV_3$, so that input inverter $INV_3$ can operate normally. Because, at this time, sub-control signal $S_{CK}$ represents "turn on," switch $SW_K$ conducts, so that output node O of input inverter $INV_3$ can couple to voltage source $V_{SS}$ through switch $SW_K$. In other words, disabling module 320 will pull down voltage on output node O of input inverter $INV_3$ to low voltage through voltage source $V_{SS}$, so that input inverter $INV_3$ outputs middle signal $S_{MI}$ representing logic 0. In this way, output inverter $INV_4$ will generate output-enabling signal $S_{ENO}$ representing "not enabled" (high voltage) according to middle signal $S_{MI}$ representing logic 0 (low voltage).

Additionally, in segment $T_{S21}$ of detection period $T_{S2}$, power switch $SWN_{VDD}$ conducts, and at this time transistor $Q_{P1}$ of input inverter $INV_3$ and switch $SW_K$ receive input-enabling signal $S_{ENI}$ representing "enabled" (logic 0, low voltage) and sub-control signal $S_{CK}$ representing "turn on," respectively, and conduct. Thus, voltage source $V_{DD}$ will couple to voltage source $V_{SS}$ through power switch $SWN_{VDD}$, transistor $Q_{P1}$ of input inverter $INV_3$ and switch $SW_K$. In this way, current $I_L$ will become a high current due to voltage source $V_{DD}$ coupling to voltage source $V_{SS}$. At this time, current $I_L$ is a leakage current between voltage source $V_{DD}$ and disabling module 220. And, from the above, it can be seen that when leakage current $I_L$ exists between voltage source $V_{DD}$ and disabling module 320, it represents control output node $P_{CO}$ is coupled to voltage source $V_{SS}$ through disabling module 320, such that voltage of control output node $P_{CO}$ is pulled down to voltage of voltage source $V_{SS}$.

In segment $T_{S22}$ of detection period $T_{S2}$, periodic pulse signal $S_{CLK}$ represents "turn off." Thus, at this time, power switch control signal $S_{SWN}$ outputted by logic processor 310 of current control circuit 330 is dependent on output-enabling signal $S_{ENO}$. Because output-enabling signal $S_{ENO}$ represents "not enabled," logic processor 310 outputs power switch control signal $S_{SWN}$ representing "turn off." In other words, logic processor 310 will turn off power switch $SWN_{VDD}$ to decouple input inverter $INV_3$ from voltage source $V_{DD}$, such that voltage source $V_{DD}$ does not couple to voltage source $V_{SS}$. In this way, current $I_L$ will drop to zero. In other words, current control circuit 330 may selectively cut off leakage current between voltage source $V_{DD}$ and disabling module 320 according to periodic clock signal $S_{CLK}$ and output-enabling signal $S_{ENO}$.

It can be seen from the above that when input-enabling signal $S_{ENI}$ represents "enabled" and control signal $S_C$ represents "disabled," in segment $T_{S21}$, logic processor 310 receives periodic pulse signal $S_{CLK}$ representing "turn on," so that power switch $SWN_{VDD}$ conducts, causing voltage source $V_{DD}$ to couple to voltage source $V_{SS}$, and generating large current. However, in segment $T_{S22}$, output-enabling signal $S_{ENO}$ representing "not enabled" causes logic processor 310 to turn off power switch $SWN_{VDD}$ to decouple input inverter $INV_3$ from voltage source $V_{DD}$, so that voltage source $V_{DD}$ will not couple to voltage source $V_{SS}$. Thus, the embodiments can design the value of predetermined pulse width $T_P$, so that segment $T_{S21}$ has length much shorter than segment $T_{S22}$. In this way, time that voltage source $V_{DD}$ is coupled to voltage source $V_{SS}$ in wire-OR matching circuit 300 can be reduced to prevent generation of high currents and high power consumption.

Additionally, in wire-OR matching circuit 300, when input-enabling signal $S_{ENI}$ represents "not enabled," regardless of whether control signal $S_C$ represents "disabled" or "not disabled," middle signal $S_{MI}$ outputted by input inverter $INV_3$ is logic 0, so that output-enabling signal $S_{ENO}$ generated by output inverter $INV_4$ represents "not enabled."

Further, in wire-OR matching circuit 300, logic processor 310 may be realized through flip-flops and/or latches.

Figure 5:
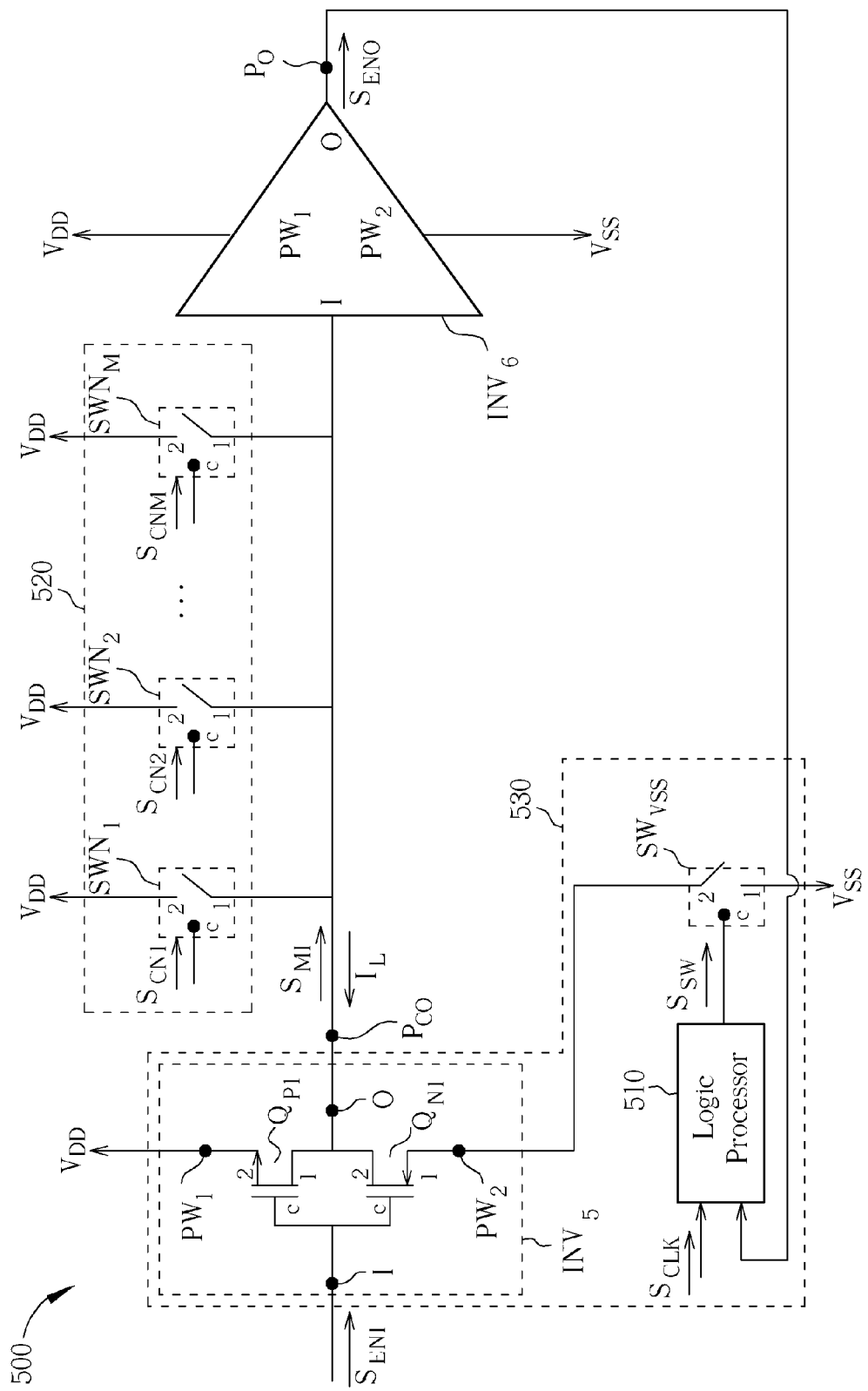
FIG. 5 is a diagram of a wire-OR matching circuit according to an embodiment.

Please refer to FIG. 5. FIG. 5 is a diagram of a wire-OR matching circuit 500 according to an embodiment. Wire-OR matching circuit 500 is used for generating output-enabling signal $S_{ENO}$ according to input-enabling signal $S_{ENI}$ and control signal $S_{CN}$. Wire-OR matching circuit 500 comprises an output node $P_O$, an output inverter $INV_6$, a disabling module 520, and a current control circuit 530. Current control circuit 530 comprises a logic processor 510, an input inverter $INV_5$, and a power switch $SW_{VSS}$. Logic processor 510, input inverter $INV_5$, and output inverter $INV_6$ have similar structure and operating principles to logic processor 310, input inverter $INV_1$, and output inverter $INV_2$, so description thereof is not repeated here. Output node $P_O$ is output node O of output inverter $INV_6$. In other words, output node $P_O$ is used for generating output-enabling signal $S_{ENO}$. Additionally, output node $P_{CO}$ in FIG. 5 represents a control output node, control output node $P_{CO}$ couples to input node I of output inverter $INV_6$ and output node O of input inverter $INV_5$, and voltage of control output node $P_{CO}$ is the inverse of voltage of output-enabling signal $S_{ENO}$. Compared to disabling module 320 and power switch $SWN_{VDD}$ of wire-OR matching circuit 300, disabling module 520 is coupled between voltage source $V_{DD}$ and output node O of input inverter $INV_5$, and power switch $SW_{VSS}$ is coupled between input inverter $INV_5$ and voltage source $V_{SS}$. Additionally, in wire-OR matching circuit 500, when input-enabling signal $S_{ENI}$ and output-enabling signal $S_{ENO}$ are logic 1 (high voltage), input-enabling signal $S_{ENI}$ and output-enabling signal $S_{ENO}$ represent "enabled." When input-enabling signal $S_{ENI}$ and output-enabling signal $S_{ENO}$ are logic 0 (low voltage), input-enabling signal $S_{ENI}$ and output-enabling signal $S_{ENO}$ represent "not enabled."

Power switch $SW_{VSS}$ is used for controlling whether or not voltage source $V_{SS}$ powers input inverter $INV_5$ according to power switch control signal $S_{SW}$. More specifically, control node C of power switch $SW_{VSS}$ is used for receiving power switch control signal $S_{SW}$. When power switch control signal $S_{SW}$ represents "turn on," first node 1 of power switch $SW_{VSS}$ couples to second node 2 of power switch $SW_{VSS}$, so that voltage source $V_{SS}$ couples to power node $PW_2$ of input inverter $INV_5$ through power switch $SW_{VSS}$ to power input inverter $INV_5$. However, when power switch control signal $S_{SW}$ represents "turn off," first node 1 of power switch $SW_{VSS}$ does not couple to second node 2 of power switch $SW_{VSS}$. In this way, voltage source $V_{SS}$ cannot couple to power node $PW_2$ of input inverter $INV_5$ through power switch $SW_{VSS}$, and does not power input inverter $INV_5$. Additionally, power switch $SW_{VSS}$ can be realized as an NMOS transistor. At this time, when power switch control signal $S_{SW}$ is logic 1 (high voltage), power switch control signal $S_{SW}$ represents "turn on," so that power switch $SW_{VSS}$ can conduct. When power switch control signal $S_{SW}$ is logic 0 (low voltage), power switch control signal $S_{SW}$ represents "turn off," and power switch $SW_{VSS}$ can be turned off.

Disabling module 520 comprises switches $SWN_1$-$SWN_M$. Control nodes C of switches $SWN_1$-$SWN_M$ respectively receive sub-control signals $S_{CN1}$-$S_{CNM}$ comprised by control signal $S_{CN}$, first nodes 1 of switches $SWN_1$-$SWN_M$ are all coupled to output node O of input inverter $INV_5$, and second nodes 2 of switches $SWN_1$-$SWN_M$ are all coupled to voltage source $V_{DD}$. Similar to switches $SW_1$-$SW_M$ of disabling module 320, each switch $SWN_1$-$SWN_M$ couples its first node 1 to its second node 2 according to sub-control signal received thereby. In disabling module 520, switches $SWN_1$-$SWN_M$ can be realized by PMOS transistors. Thus, when sub-control signals $S_{CN1}$-$S_{CNM}$ are logic 0 (low voltage), sub-control signals $S_{CN1}$-$S_{CNM}$ represent "turn on," and switches $SWN_1$-$SWN_M$ can conduct. When sub-control signals $S_{CN1}$-$S_{CNM}$ are logic 1 (high voltage), sub-control signals $S_{CN1}$-$S_{CNM}$ represent "turn off," and switches $SWN_1$-$SWN_M$ can be turned off.

In disabling module 520, when control signal $S_{CN}$ represents "disabled," it means that at least one sub-control signal (e.g. $S_{CNK}$) of sub-control signals $S_{CN1}$-$S_{CNM}$ represents "turn on." Thus, at this time, in disabling module 520, switch $SWN_K$ corresponding to sub-control signal $S_{CNK}$ conducts. In this way, middle signal $S_{MI}$ outputted by input inverter $INV_5$ couples to voltage source $V_{DD}$ through switch $SWN_K$, so that voltage on output node O of input inverter $INV_5$ will be pulled up to high voltage and become logic 1. Thus, when control signal $S_{CN}$ represents "disabled," disabling module 520 controls middle signal $S_{MI}$ outputted by input inverter $INV_5$ to be logic 1 (high voltage). However, when control signal $S_{CN}$ represents "not disabled," it means that sub-control signals $S_{CN1}$-$S_{CNM}$ are all "turn off," so that none of the switches SWN$_1$-SWN$_M$ conducts. In this way, disabling module 520 does not affect logic represented by middle signal S$_{MI}$.

Figure 6:
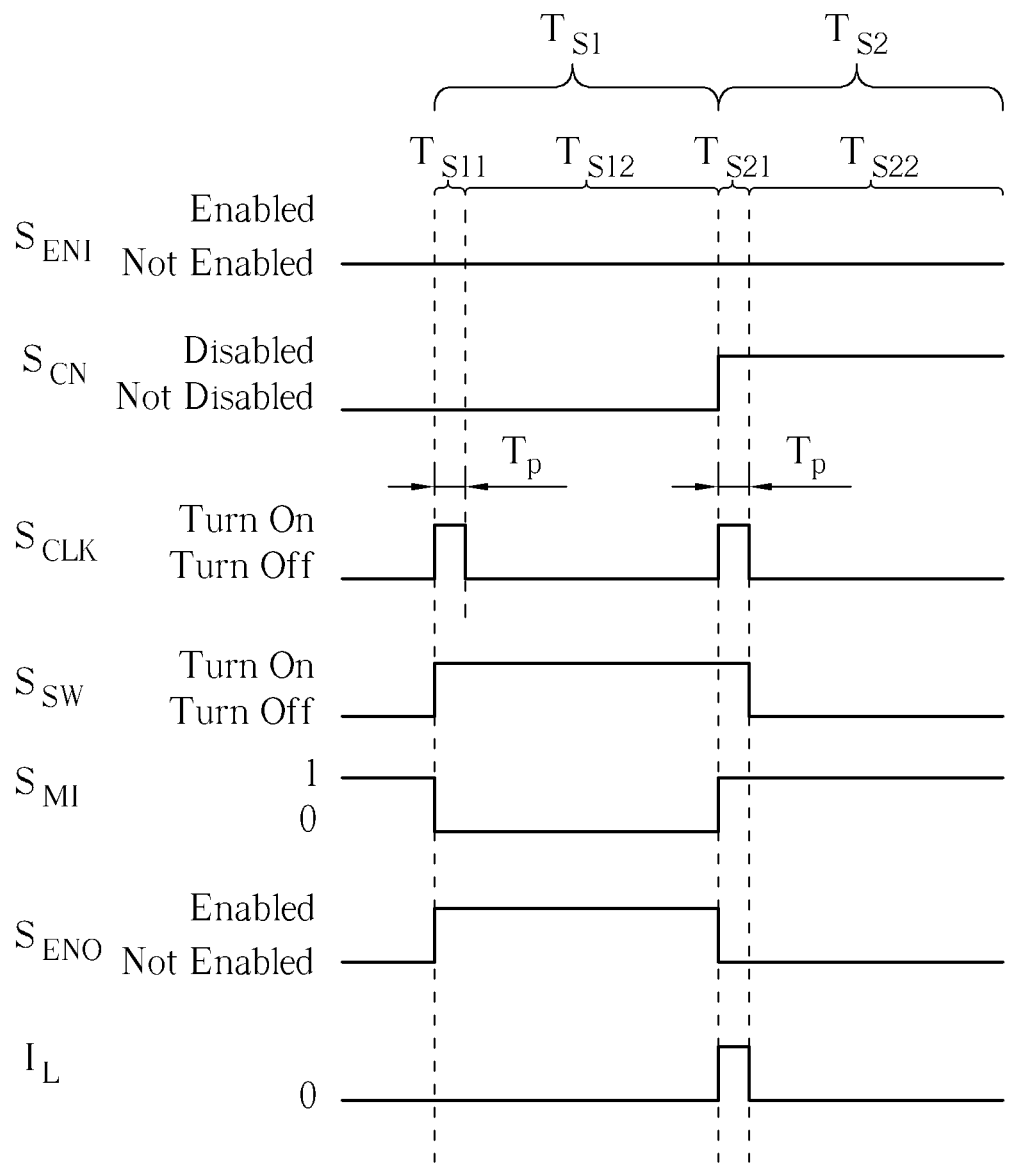
FIG. 6 is a diagram illustrating operating principles of the wire-OR matching circuit of FIG. 5.

Please refer to FIG. 6. FIG. 6 is a diagram illustrating operating principles of the wire-OR matching circuit 500 of FIG. 5. FIG. 6 can be described in terms of detection period T$_{S1}$ and detection period T$_{S2}$. Detection periods T$_{S1}$, T$_{S2}$ both have length equaling changes in predetermined period T$_S$ of control signal S$_{CN}$. In detection period T$_{S1}$, input-enabling signal S$_{ENI}$ is set to represent "enabled" and control signal S$_{CN}$ to represent "not disabled." In detection period T$_{S2}$, input-enabling signal S$_{ENI}$ is set to represent "enabled" and control signal S$_{CN}$ to represent "disabled."

In segment T$_{S11}$ of detection period T$_{S1}$, logic processor 510 receives periodic pulse signal S$_{CLK}$ representing "turn on," and outputs power switch control signal S$_{SW}$ representing "turn on" accordingly. Segment T$_{S11}$ has length equaling predetermined pulse width T$_P$ of periodic pulse signal S$_{CLK}$ representing "turn on." At this time, switch SWN$_{VDD}$ conducts, so that voltage source V$_{SS}$ couples to input inverter INV$_5$ through power switch SW$_{VSS}$ to power input inverter INV$_5$ to cause input inverter INV$_5$ to operate normally. Because, at this time, control signal S$_{CN}$ represents "not disabled," disabling module 520 does not affect logic represented by middle signal S$_{MI}$. More specifically, at this time, all sub-control signals S$_{CN1}$-S$_{CNM}$ are "turn off," so that none of switches SWN$_1$-SWN$_M$ of disabling module 520 conducts. In other words, output node O of input inverter INV$_5$ cannot couple to voltage source V$_{DD}$ through switches SWN$_1$-SWN$_M$ of disabling module 520, and voltage on output node O will not be pulled up to high voltage by voltage source V$_{DD}$. In this way, input inverter INV$_5$ outputs middle signal S$_{MI}$ representing logic 0 (low voltage) according to input-enabling signal S$_{ENI}$ representing "enabled" (logic 1, high voltage), and output inverter INV$_6$ generates output-enabling signal S$_{ENO}$ representing "enabled" (logic 1, high voltage) accordingly. Additionally, none of switches SWN$_1$-SWN$_M$ of disabling module 520 conducts, thus voltage source V$_{SS}$ is not coupled to voltage source V$_{DD}$. In this way, wire-OR matching circuit 500 does not generate high current.

In segment T$_{S12}$ of detection period T$_{S1}$, periodic pulse signal S$_{CLK}$ represents "turn off." At this time, power switch control signal S$_{SW}$ outputted by logic processor 510 is dependent on output-enabling signal S$_{ENO}$. Because, at this time, output-enabling signal S$_{ENO}$ represents "enabled," logic processor 510 will continue to output power switch control signal S$_{SWN}$ representing "turn on." However, none of switches SWN$_1$-SWN$_M$ of disabling module 520 conducts, so voltage source V$_{SS}$ will not couple to voltage source V$_{DD}$. It can be seen, then, that when input-enabling signal S$_{ENI}$ represents "enabled" and control signal S$_{CN}$ represents "not disabled," current I$_L$ on output node O of input inverter INV$_5$ of wire-OR matching circuit 500 is zero, which will not cause extra power consumption.

In segment T$_{S21}$ of detection period T$_{S2}$, logic processor 510 receives periodic pulse signal S$_{CLK}$ representing "turn on," and outputs power switch control signal S$_{SW}$ representing "turn on" accordingly. Segment T$_{S21}$ has length equaling predetermined pulse width T$_P$ of periodic pulse signal S$_{CLK}$ representing "turn on." At this time, power switch SW$_{VSS}$ conducts, so that voltage source V$_{SS}$ couples to input inverter INV$_5$ through power switch SW$_{VSS}$ to power input inverter INV$_5$ for input inverter INV$_5$ to operate normally. Because, at this time, sub-control signal S$_{CNK}$ represents "turn on," switch SWN$_K$ conducts, so that output node O of input inverter INV$_5$ can couple to voltage source V$_{DD}$ through switch SWN$_K$. In other words, disabling module 520 pulls voltage on output node O of input inverter INV$_5$ up to high voltage through voltage source V$_{DD}$, so that input inverter INV$_5$ outputs middle signal S$_{MI}$ representing logic 1. In this way, output inverter INV$_6$ outputs output-enabling signal S$_{ENO}$ representing "not enabled" (low voltage) according to middle signal S$_{MI}$ representing logic 1 (high voltage).

Additionally, because power switch SW$_{VSS}$ conducts in segment T$_{S21}$ of detection period T$_{S2}$, at this time, transistor Q$_{N1}$ of input inverter INV$_5$ and switch SWN$_K$ respectively receive input-enabling signal S$_{ENI}$ representing "enabled" (logic 1, high voltage) and sub-control signal S$_{CNK}$ representing "turn on," and conduct. Thus, voltage source V$_{SS}$ couples to voltage source V$_{DD}$ through power switch SW$_{VSS}$, transistor Q$_{N1}$ of input inverter INV$_5$, and switch SWN$_K$. In this way, current I$_L$ becomes high current due to voltage source V$_{DD}$ coupling to voltage source V$_{SS}$. At this time, current I$_L$ is leakage current between voltage source V$_{SS}$ and disabling module 520. And, it can be seen from the above that when leakage current I$_L$ exists between voltage source V$_{SS}$ and disabling module 520, it means that control output node P$_{CO}$ couples to voltage source V$_{DD}$ through disabling module 520, such that voltage of control output node P$_{CO}$ is pulled up to voltage level of voltage source V$_{DD}$.

In segment T$_{S22}$ of detection period T$_{S2}$, periodic pulse signal S$_{CLK}$ represents "turn off." Thus, at this time, power switch control signal S$_{SW}$ outputted by logic processor 510 of current control circuit 530 is dependent on output-enabling signal S$_{ENO}$. Because at this time, output-enabling signal S$_{ENO}$ represents "not enabled," logic processor 510 outputs power switch control signal S$_{SW}$ representing "turn off." In other words, logic processor 510 will turn off power switch SW$_{VSS}$ to decouple input inverter INV$_5$ from voltage source V$_{SS}$, so that voltage source V$_{SS}$ will not couple to voltage source V$_{DD}$. In this way, current I$_L$ drops to zero. In other words, current control circuit 530 selectively cuts off leakage current between voltage source V$_{SS}$ and disabling module 520 according to periodic clock signal S$_{CLK}$ and output-enabling signal S$_{ENO}$.

It can be seen from the above that, when input-enabling signal S$_{ENI}$ represents "enabled" and control signal S$_{CN}$ represents "disabled," in segment T$_{S21}$, logic processor 510 receives periodic pulse signal S$_{CLK}$ representing "turn on," and causes power switch SW$_{VSS}$ to conduct, which causes voltage source V$_{SS}$ to couple to voltage source V$_{DD}$ and generate high current. However, in segment T$_{S22}$, output-enabling signal S$_{ENO}$ representing "not enabled" causes logic processor 510 to turn off power switch SW$_{VSS}$ to decouple input inverter INV$_5$ from voltage source V$_{SS}$, so that voltage source V$_{SS}$ will not couple to voltage source V$_{DD}$. Thus, segment T$_{S21}$ can be much shorter than segment T$_{S22}$ through design of value of predetermined pulse width T$_P$. In this way, time that voltage source V$_{SS}$ is coupled to voltage source V$_{DD}$ in wire-OR matching circuit 500 can be reduced to prevent generation of high current and power consumption.

Additionally, in wire-OR matching circuit 500, when input-enabling signal S$_{ENI}$ represents "not enabled," regardless of whether control signal S$_{CN}$ represents "disabled" or "not disabled," logic of middle signal S$_{MI}$ outputted by input inverter INV$_5$ is 1, so that output-enabling signal S$_{ENO}$ generated by output inverter INV$_6$ represents "not enabled."

Additionally, in wire-OR matching circuit 500, logic processor 510 may be realized by flip-flops and/or latches.

Wire-OR matching circuit can be enabled by inputting input-enabling signal representing "enabled," so that wire-OR matching circuit can generate output-enabling signal according to control signal and periodic pulse signal. When periodic pulse signal represents "turn on," at this time, if input-enabling signal represents "enabled" and control signal represents "not disabled," wire-OR matching circuit outputs output-enabling signal representing "enabled." If input-enabling signal represents "enabled" and control signal represents "disabled," wire-OR matching circuit outputs output-enabling signal representing "not enabled." And, wire-OR matching circuit can shorten time that voltage source $V_{DD}$ couples to voltage source $V_{SS}$ through controlling predetermined pulse width of periodic pulse signal representing "turn on." Namely, wire-OR matching circuit can rapidly disconnect high voltage source from low voltage source through controlling predetermined pulse width of periodic pulse signal to prevent generation of high current and high power consumption, which is a great convenience to the user.

Those skilled in the art will readily observe that numerous modifications and alterations of the device and method may be made while retaining the teachings of the invention.

What is claimed is:

1. A wire-OR matching circuit having low power consumption, comprising:
    an input inverter for inverting an input-enabling signal to generate a middle signal;
    a power switch coupled between the input inverter and a first voltage source for controlling the first voltage source to power the input inverter according to a power switch control signal;
        wherein when the power switch control signal represents "turn on," the first voltage source powers the input inverter through the power switch;
    a logic processor for receiving a periodic pulse signal and an output-enabling signal, and outputting the power switch control signal according thereto;
        wherein when the periodic pulse signal represents "turn on," the power switch control signal represents "turn on;"
        wherein when the periodic pulse signal represents "turn off" and the output-enabling signal represents "not enabled," the power switch control signal represents "turn off;"
        wherein when the periodic pulse signal represents "turn off" and the output-enabling signal represents "enabled," the power switch control signal represents "turn on;"
        wherein the periodic pulse signal represents "turn on" each one predetermined period, and keeps a predetermined pulse width;
    a disabling module for controlling the middle signal to represent a first predetermined logic according to a control signal;
        wherein when the control signal represents "disabled" or the input-enabling signal represents "not enabled," the middle signal represents the first predetermined logic;
        wherein when the control signal represents "not disabled," and the input-enabling signal represents "enabled," the middle signal represents a second predetermined logic; and
    an output inverter for inverting the middle signal to generate the output-enabling signal;
        wherein when the middle signal represents the first predetermined logic, the output-enabling signal represents "not enabled;"
        wherein when the middle signal represents the second predetermined logic, the output-enabling signal represents "enabled".

2. The wire-OR matching circuit of claim 1, wherein the input inverter comprises:
    a first transistor comprising:
        a first node coupled to the first voltage source through the power switch;
        a second node coupled to the output inverter and the disabling module for generating the middle signal; and
        a control node for receiving the input-enabling signal;
        wherein when the input-enabling signal represents "enabled," the first node of the first transistor is coupled to the second node of the first transistor; and
    a second transistor comprising:
        a first node coupled to the second node of the first transistor;
        a second node coupled to a second voltage source; and
        a control node for receiving the input-enabling signal;
        wherein when the input-enabling signal represents "not enabled," the first node of the second transistor is coupled to the second node of the second transistor.

3. The wire-OR matching circuit of claim 2, wherein the disabling module comprises:
    M switches for controlling the middle signal to represent the first predetermined logic according to M sub-control signals;
        wherein a Kth switch of the M switches comprises:
            a first node coupled to the second node of the first transistor;
            a second node coupled to the second voltage source; and
            a control node for receiving a Kth sub-control signal of the M sub-control signals;
            wherein when the Kth sub-control signal of the M sub-control signals represents "turn on," the first node of the Kth switch of the M switches couples to the second node of the Kth switch of the M switches;
        wherein M and K are positive integers, and $1 \leq K \leq M$;
        wherein when the Kth sub-control signal of the M sub-control signals represents "turn on," the control signal represents "disabled;"
        wherein when all of the M sub-control signals represent "turn off," the control signal represents "not disabled".

4. The wire-OR matching circuit of claim 3, wherein when the input-enabling signal represents "enabled," the input-enabling signal is a low voltage; when the input-enabling signal represents "not enabled," the input-enabling signal is a high voltage; when the output-enabling signal represents "enabled," the output-enabling signal is a low voltage; when the output-enabling signal represents "not enabled," the output-enabling signal is a high voltage; when the middle signal represents the first predetermined logic, the middle signal is a low voltage; and when the middle signal represents the second predetermined logic, the middle signal is a high voltage.

5. The wire-OR matching circuit of claim 4, wherein the first transistor is a P-channel Metal Oxide Semiconductor (PMOS) transistor, and the second transistor is a N-channel Metal Oxide Semiconductor (NMOS) transistor.

6. The wire-OR matching circuit of claim 4, wherein the M switches are all NMOS transistors; when the Kth sub-control signal of the M sub-control signals represents "turn on," the Kth sub-control signal of the M sub-control signals is a high voltage; and when the Kth sub-control signal of the M sub-control signals represents "turn off," the Kth sub-control signal of the M sub-control signals is a low voltage.

7. The wire-OR matching circuit of claim 3, wherein when the input-enabling signal represents "enabled," the input-enabling signal is a high voltage; when the input-enabling signal represents "not enabled," the input-enabling signal is a low voltage; when the output-enabling signal represents "enabled," the output-enabling signal is a high voltage; when the output-enabling signal represents "not enabled," the output-enabling signal is a low voltage; when the middle signal represents the first predetermined logic, the middle signal is a high voltage; and when the middle signal represents the second predetermined logic, the middle signal is a low voltage.

8. The wire-OR matching circuit of claim 7, wherein the second transistor is a PMOS transistor, and the first transistor is a NMOS transistor.

9. The wire-OR matching circuit of claim 7, wherein the M switches are all PMOS transistors; when the Kth sub-control signal of the M sub-control signals represents "turn on," the Kth sub-control signal of the M sub-control signals is a low voltage; and when the Kth sub-control signal of the M sub-control signals represents "turnoff," the Kth sub-control signal of the M sub-control signals is a high voltage.

10. The wire-OR matching circuit of claim 1, wherein the logic processor is a flip-flop or a latch.

11. The wire-OR matching circuit of claim 1, wherein the predetermined period is approximately equal to period of change of the control signal.

12. A wire-OR matching circuit having low power consumption, comprising:
   an output node for outputting an output-enabling signal;
   a disabling module coupled between a first reference voltage and a control output node, the disabling module comprising a plurality of switches, each switch having a first node coupled to the first reference voltage, and another node coupled to the control output node;
   wherein voltage of the output-enabling signal is inverse of voltage of the control output node; and
   a current control circuit coupled to the output node, the control output node, and a second reference voltage, the current control circuit selectively cutting off a leakage current between the second reference voltage and the disabling module according to a periodic clock signal and the output-enabling signal.

13. The wire-OR matching circuit of claim 12, wherein when the leakage current exists between the second reference voltage and the disabling module, voltage of the control output node is pulled to the first reference voltage.

14. The wire-OR matching circuit of claim 12, further comprising an output inverter coupled between the control output node and the output node for inverting voltage of the control output node to generate the output-enabling signal.

15. The wire-OR matching circuit of claim 14, wherein the current control circuit comprises:
   a logic processor for receiving the periodic clock signal and the output-enabling signal to generate a power switch control signal;
   an input inverter coupled to the control output node, the input inverter used for inverting an input-enabling signal;
   a power switch coupled to the second reference voltage, the input inverter, and the logic processor, the power switch selectively decoupling the second reference voltage from the input inverter according to the power switch control signal to cut off leakage current between the second reference voltage and the disabling module.

16. The wire-OR matching circuit of claim 15, wherein when the periodic clock signal represents "turn on," the power switch control signal represents "turn on;" when the periodic pulse signal represents "turn off" and the output-enabling signal represents "not enabled," the power switch control signal represents "turn off;" when the periodic pulse signal represents "turn off" and the output-enabling signal represents "enabled," the power switch control signal represents "turn on;" and when the power switch control signal represents "turn on," the power switch does not decouple the second reference voltage from the input inverter.

17. The wire-OR matching circuit of claim 16, wherein the disabling module selectively couples the first reference voltage and the control output node according to a plurality of sub-control signals.

* * * * *